United States Patent
Han et al.

(10) Patent No.: US 10,718,672 B2
(45) Date of Patent: Jul. 21, 2020

(54) PIEZOELECTRIC DEVICE PACKAGE

(71) Applicant: SAMSUNG ELECTRO-MECHANICS CO., LTD., Suwon-si, Gyeonggi-do (KR)

(72) Inventors: Jin Man Han, Suwon-si (KR); Yong Sung Kim, Suwon-si (KR); Sang Yeob Cha, Suwon-si (KR); Young Key Kim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 351 days.

(21) Appl. No.: 15/712,920

(22) Filed: Sep. 22, 2017

(65) Prior Publication Data
US 2018/0209855 A1  Jul. 26, 2018

(30) Foreign Application Priority Data

Jan. 20, 2017 (KR) .................. 10-2017-0010032

(51) Int. Cl.
*G01K 7/22* (2006.01)
*H01L 23/04* (2006.01)
*G01K 7/32* (2006.01)
*H03B 5/04* (2006.01)
*H03H 9/02* (2006.01)
*H03B 5/36* (2006.01)
*H03H 9/05* (2006.01)
*H03H 9/10* (2006.01)
(Continued)

(52) U.S. Cl.
CPC ............ *G01K 7/22* (2013.01); *G01K 7/245* (2013.01); *G01K 7/32* (2013.01); *H01L 23/04* (2013.01); *H03B 5/04* (2013.01); *H03B 5/366* (2013.01); *H03H 9/02102* (2013.01); *H03H 9/0552* (2013.01); *H03H 9/08* (2013.01); *H03H 9/1021* (2013.01); *H01L 41/0533* (2013.01)

(58) Field of Classification Search
CPC combination set(s) only.
See application file for complete search history.

(56) References Cited

U.S. PATENT DOCUMENTS

2003/0231073 A1  12/2003  Tanaka et al.
2014/0355647 A1*  12/2014  Lee .................. H01L 41/25
                                                    374/117
(Continued)

FOREIGN PATENT DOCUMENTS

JP  2004-320417 A  11/2004
JP  2013-146003 A  7/2013
(Continued)

OTHER PUBLICATIONS

English Translation of JP 2013-146004 (Year: 2013).*
(Continued)

*Primary Examiner* — Bryan P Gordon
(74) *Attorney, Agent, or Firm* — Morgan, Lewis & Bockius LLP

(57) ABSTRACT

A piezoelectric device package includes a board having a lower surface and an upper surface, a plurality of terminals disposed on the lower surface, a piezoelectric device disposed on the upper surface, a thermistor layer and a resistance layer disposed on the lower surface, and a cap lead covering an upper portion of the board.

16 Claims, 4 Drawing Sheets

(51) Int. Cl.
*H03H 9/08* (2006.01)
*G01K 7/24* (2006.01)
*H01L 41/053* (2006.01)

(56) References Cited

U.S. PATENT DOCUMENTS

| | | | | |
|---|---|---|---|---|
| 2015/0116052 A1* | 4/2015 | Kikushima | .......... | H03H 9/0552 331/158 |
| 2015/0249199 A1* | 9/2015 | Yanata | ................ | H03H 9/1021 310/344 |
| 2015/0295557 A1* | 10/2015 | Takase | ................ | H03H 9/1021 310/315 |
| 2016/0197594 A1* | 7/2016 | Hanzawa | ............... | H01C 7/008 310/348 |

FOREIGN PATENT DOCUMENTS

| | | |
|---|---|---|
| JP | 2013-0146004 A | 7/2013 |
| JP | 2015-029201 A | 2/2015 |
| KR | 10-0965468 B1 | 6/2010 |
| KR | 10-2014-0142016 | 12/2014 |

OTHER PUBLICATIONS

Notice Of Reason for Rejection issued in Korean Patent Application No. 10-2017-0010032, dated Feb. 12, 2018 (with English abstract).

\* cited by examiner

PIEZOELECTRIC DEVICE PACKAGE

CROSS-REFERENCE TO RELATED APPLICATION(S)

This application claims the benefit of priority to Korean Patent Application No. 10-2017-0010032, filed on Jan. 20, 2017 with the Korean Intellectual Property Office, the disclosure of which is incorporated herein by reference in its entirety.

TECHNICAL FIELD

The present disclosure relates to a piezoelectric device package.

BACKGROUND

When a voltage is applied to a piezoelectric device, stress is added thereto due to an electrostrictive effect, such that vibrations are generated. When vibrations are generated, a regularly oscillating signal is generated by a piezoelectric effect. A crystal oscillator is an electronic component providing this signal as a standard frequency source. In general, since the crystal oscillator uses a quartz crystal formed of $SiO_2$ as the piezoelectric device, the crystal oscillator is known as a quartz oscillator.

In quartz oscillator, a constant frequency which is stable, in a wide use temperature range, even in the case of an external temperature change, should be maintained. Therefore, a quartz oscillator having more stable and accurate characteristics may be implemented by providing a compensation circuit compensating for a frequency depending on a temperature in the quartz oscillator to decrease a deviation of the frequency.

Recently, as performance of integrated circuit (IC) apparatuses has improved, high-end piezoelectric device packages capable of replacing temperature compensation crystal oscillators (PCXO) used in the related art have been required.

Therefore, a piezoelectric device package capable of being miniaturized while maintaining a frequency stable in the case of an external temperature change is required.

SUMMARY

An aspect of the present disclosure may provide a piezoelectric device package capable of significantly decreasing a resonance frequency variation while being thinned, and contributing to the integration of a circuit.

According to an aspect of the present disclosure, a piezoelectric device package may include: a board having a lower surface on which a plurality of terminals are disposed; a piezoelectric device disposed on an upper surface of the board; a thermistor layer and a resistance layer disposed on the lower surface of the board; and a cap lead covering an upper portion of the board.

According to another aspect of the present disclosure, a piezoelectric device package may include: a board having first and second surfaces; first to fifth terminals disposed on the first surface of the board; a first excitation terminal disposed on the second surface of the board and connected to the first terminal and a second excitation terminal disposed on the second surface of the board and connected to the second terminal; a piezoelectric device mounted on the first and second excitation terminals; a thermistor layer disposed on the first surface of the board and connected to the third and fourth terminals; and a resistance layer disposed on the first surface of the board and connected to the fourth and fifth terminals.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Figure 1:
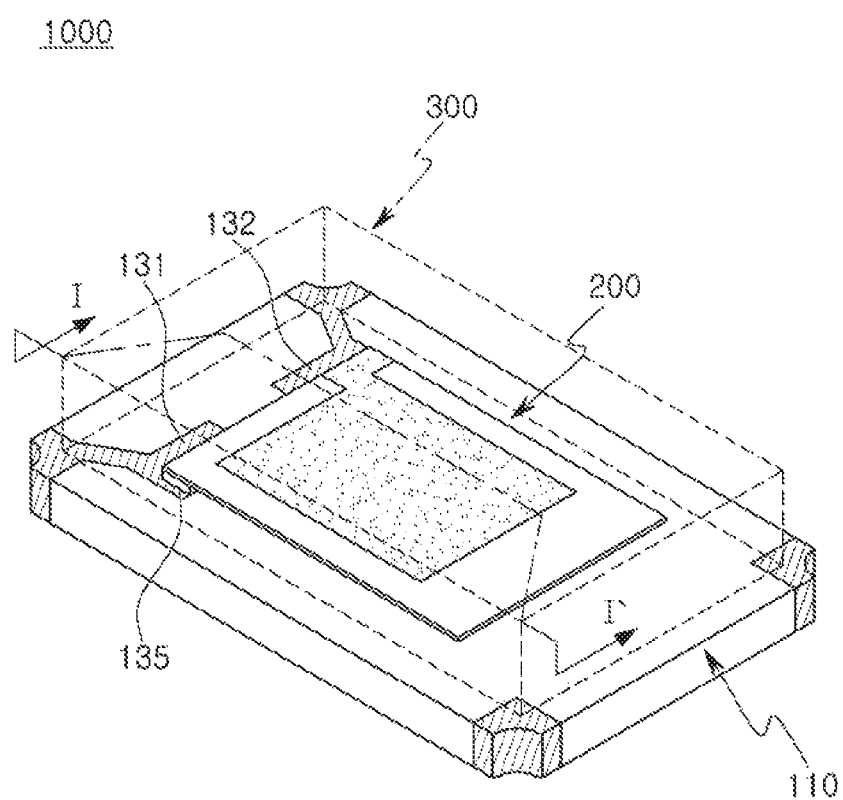
FIG. 1 is a perspective view illustrating a piezoelectric device package according to exemplary embodiments of the present disclosure.

FIG. 1 is a perspective view illustrating a piezoelectric device package according to an exemplary embodiment of the present disclosure.

Referring to FIG. 1, a piezoelectric device package 1000 according to the example embodiment of the present disclosure may include a board 110, a piezoelectric device 200, a cap lead 300, and a thermistor layer and a resistance layer formed on a lower surface of the board 110. The thermistor layer and the resistance layer formed on the lower surface of the board 110 may be confirmed, or shown, in FIGS. 2 and 4.

The board 110 may have upper and lower (first and second) surfaces. The upper surface of the board may be provided as a mounting surface of the piezoelectric device, and the lower surface thereof may be provided as a surface on which the thermistor layer and the resistance layer are formed.

The board 110 may be a printed circuit board. Further, the board 110 may contain a ceramic material such as alumina ($Al_2O_3$) or a polymer material, but is not limited thereto. In order to improve temperature sensitivity of a thermistor layer 140, the board 110 may be formed of a material having excellent thermal conductivity or formed using a ceramic material in which a material having excellent thermal conductivity is dispersed.

The piezoelectric device 200 may be disposed on the upper surface of the board. The piezoelectric device 200 may be manufactured by cutting quartz composed of $SiO_2$ and forming excitation electrodes on upper and lower surfaces of the cut quartz. The excitation electrodes of the piezoelectric device 200 may be connected to first and second excitation terminals 131 and 132 disposed on the upper surface of the board 110. To this end, the piezoelectric device 200 may be mounted on the first and second excitation terminals 131 and 132 using a conductive adhesive 135.

The cap lead 300 may be disposed on an upper portion of the board 110. The cap lead 300 may be attached to the upper surface of the board 110 while having a cavity in which the piezoelectric device 200 is accommodated, thereby blocking external influences from the piezoelectric device 200.

Figure 2:
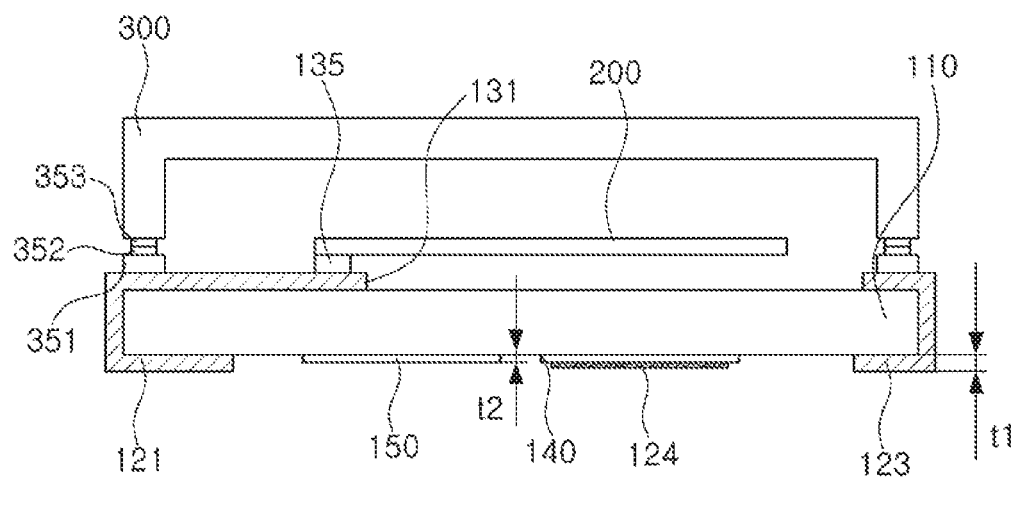
FIG. 2 is a cross-sectional view taken along line I-I' of FIG. 1.

FIG. 2 is a cross-sectional view taken along line I-I' of FIG. 1. Referring to FIG. 2, the piezoelectric device package 1000 according to the exemplary embodiment of the present disclosure may include the board 110, the piezoelectric device 200, the cap lead 300, the thermistor layer 140 and a resistance layer 150.

Further, a plurality of terminals may be disposed on the lower surface of the board 110. Although a first terminal 121, a third terminal 123, and a fourth terminal 124 are illustrated in FIG. 2, the piezoelectric device package may include the plurality of terminals disposed for mounting. In addition, some of the plurality of terminals may be extended to the upper surface of the board 110. As illustrated in FIG. 2, the first terminal 131 may be extended to the upper surface of the board 110 to thereby be connected to the first excitation terminal 131. Further, the piezoelectric device 200 may be connected to the first excitation terminal 131 through the conductive adhesive 135.

The thermistor layer 140 may be formed on the lower surface of the board 110. The thermistor layer may be formed using a negative temperature coefficient (NTC) thermistor composition and a thick film method. A negative temperature coefficient (NTC) thermistor may mean a thermistor of which a resistance value is decreased when a temperature is increased.

A main ingredient of the NTC thermistor composition may serve as a ceramic semiconductor imparting conductivity to the NTC thermistor, and the principle to impart conductivity is as follows.

The NTC thermistor may adjust an electric charge balanced state between cations in a B-site (octahedral site) in a spinel phase having an $AB_2O_4$ crystal structure, formed during a sintering process with a composition of the NTC thermistor composition, thereby forming an electron hopping site. That is, the NTC thermistor may form a site at which electron hopping may occur and obtain energy required for electron hopping from an ambient temperature, thereby implementing non-linear resistance-temperature (R-T) characteristics in which resistance is decreased due to an increase in electron hopping caused by an increase in temperature.

In a case of disposing the thermistor in the cavity, since the thermistor and the piezoelectric device are positioned in the same space as each other, there is a risk that a resonance frequency will be changed. The thermistor layer 140 according to the exemplary embodiment of the present disclosure may be disposed on the lower surface of the board 110, thereby increasing a degree of freedom in a design, and decreasing the risk that the resonance frequency will be changed by the thermistor and the piezoelectric device positioned in the same space as each other. Further, since the thermistor layer 140 is directly formed on the board 110, a temperature of the board 110 may be accurately measured.

The resistance layer 150 may be formed on the lower surface of the board 110. The resistance layer 150 may be formed using a resistor paste and a thick film method. The resistor paste may be formed of a conductive oxide powder such as $RuO_2$, $Bi_2Ru_2O_3$, or the like, and frit used for connecting these oxides to adhere the oxide to the board and adjusting a resistance value. Further, the resistor paste may be formed of a vehicle, an organic material imparting printing properties to the resistor paste.

Although not limited, the frit may contain Ag, Pd, Cu, Ni, a Cu—Ni based alloy, a Ni—Cr based alloy, Ru oxide, a Si oxide, Mn and Mn based alloy, or the like, as a main ingredient, and contain various raw materials depending on a resistance value to be required.

Generally, in an oscillation circuit including a piezoelectric device package, a separate resistance device is required. Since the piezoelectric device package according to the exemplary embodiment of the present disclosure includes the resistance layer, the oscillation circuit may be integrated.

Meanwhile, resistance values of the thermistor layer 140 and the resistance layer 15 may be determined by a trimming process. The trimming process may mean a partial removal process for obtaining a resistance value required in designing a circuit using a fine cutting method, or the like.

A thickness t1 of the plurality of terminals including the first and third terminals 121 and 123 may be thicker than a thickness t2 of the thermistor layer 140 and the resistance layer 150. In a case in which the thickness t2 of the thermistor layer 140 and the resistance layer 150 is thicker than the thickness t1 of the first and third terminals, at the time of mounting the piezoelectric device package, it is impossible to secure flatness of the first and third terminals 121 and 123. That is, in a case in which the thickness of the thermistor 140 is thicker than the thickness of the plurality of terminals disposed on the lower surface of the board 110, some of the plurality of terminals may be detached from terminals of a circuit board on which the piezoelectric device package is mounted.

Therefore, the plurality of terminals may be formed to have the thickness t1 thicker than the thickness t2 of the thermistor layer 140 and the resistance layer 150, such that at the time of surface-mounting of the piezoelectric device package, flatness of the plurality of terminals may be secured.

The cap lead 300 may be attached to a circumferential portion of the upper surface of the board 110. To this end, the piezoelectric device package may further include a metal bonding layer bonding the board 110 and the cap lead 300 to each other. In detail, the metal bonding layer includes a first bonding layer 352 formed of a metal paste and disposed on the circumferential portion of the board 110, and a second bonding layer 353 disposed below a lower end portion of the cap lead 200. The first and second bonding layers 352 and 353 may be metal-metal bonded to each other, such that the piezoelectric device 200 may be sealed by welding. The second bonding layer 353 may be formed of Au—Sn, but is not limited thereto. Further, an insulating layer 351 may be disposed between the first bonding layer 352 and the board 110. The insulating layer 351 may be formed of a glass material, and insulate the terminals 121 and 123 extended to the upper surface of the board 110 and the first bonding layer 352 from each other.

Figure 3:
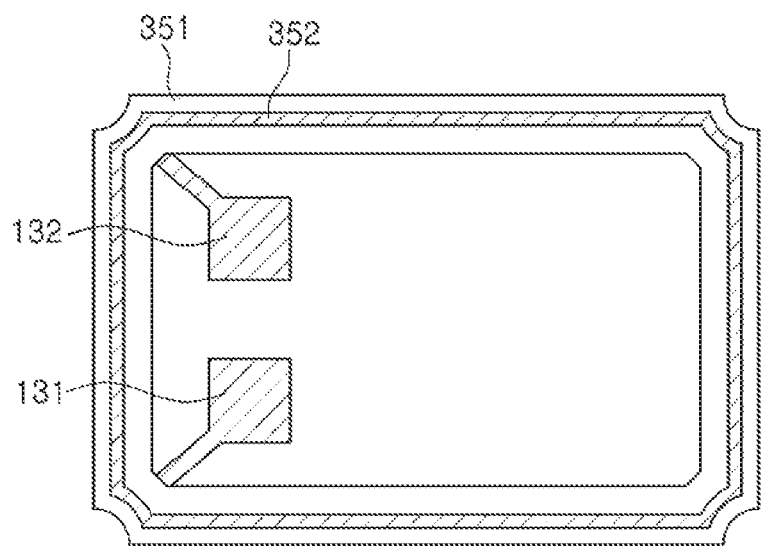
FIG. 3 is a plan view illustrating an upper surface of a board of the piezoelectric device package of FIG. 1.

Referring to FIG. 3, an example of the board 110 (in FIG. 2) having the upper surface on which the insulating layer 351 and the first bonding layer 352 are disposed in the circumferential portion may be confirmed. Meanwhile, the first and second excitation terminals 131 and 132 may be formed before the insulating layer 351 and the first bonding layer 352 are formed.

Figure 4:
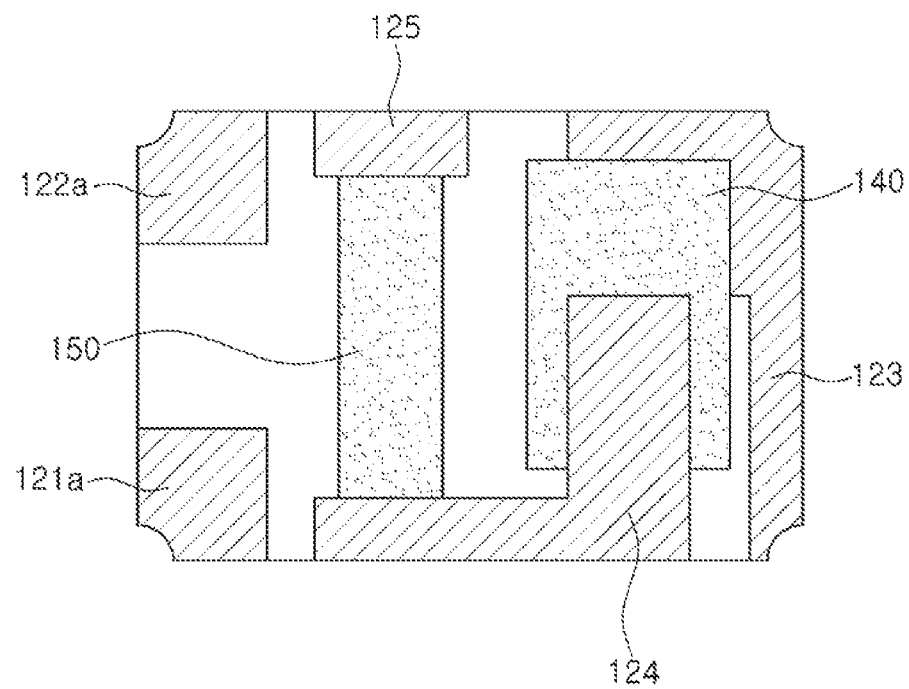
FIG. 4 is a plan view illustrating a lower surface of a board of the piezoelectric device package of FIG. 1.

FIG. 4 is a plan view illustrating a lower surface of a board of the piezoelectric device package according to the exemplary embodiment of the present disclosure. For reference, FIG. 4 is a view illustrating the lower surface of the board when viewed from above. Further, FIG. 5 is a perspective view illustrating a board of a piezoelectric device package according to exemplary embodiments of the present disclosure.

Referring to FIG. 4, first to fifth terminals 121a, 122a, 123, 124 and 125, the thermistor layer 140, and the resistance layer 150 may be disposed on the lower surface of the board. The first to fifth terminals 121a, 122a, 123, 124 and 125 may be formed on the lower surface of the board 110 using a conductive paste, but are not limited thereto.

The first to fifth terminals 121a, 122a, 123, 124 and 125, the thermistor layers 140, and the resistance layer 150 illustrated in FIG. 4 are illustrated by way of example, and dispositions, sizes and connection relationships thereof may be changed depending on a design.

Figure 5:
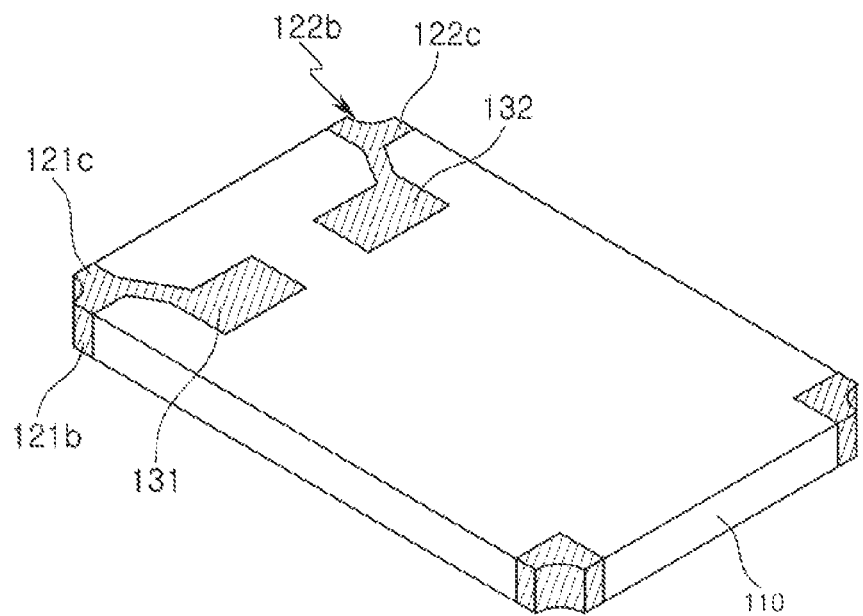
FIG. 5 is a perspective view illustrating a board of the piezoelectric device package of FIG. 1.

Referring to FIGS. 4 and 5, first terminals 121a, 121b and 121c connected to the first excitation terminal 131 and second terminal 122a, 122b and 122c connected to the second excitation terminal 132 may be confirmed. For example, the first terminal may include a first lower terminal 121a, a first side terminal 121b and a first upper terminal 121c, and the second terminal may include a second lower terminal 122a, a second side terminal 122b and a second upper terminal 122c.

In detail, the first side terminal 121b may connect the first lower terminal 121a and the first upper terminal 121c to each other. Further, the first upper terminal 121c may be connected to the first excitation terminal 131. For example, the first side terminal 121b may be disposed to cover a groove formed by partially removing a corner portion of a side surface of the board 110. That is, the groove formed by partially removing the corner portion of the side surface of the board 110 may serve to facilitate formation of the first side terminal 121b. Similarly, the second terminals 122a, 122b and 122c may be disposed similarly to the first terminals 121a, 121b and 122c to thereby be connected to the second excitation terminal 132.

In some embodiments, first and second terminals may be electrically connected to first and second excitation terminals 131 and 132, respectively, through a conductive via penetrating through a board 110.

The third and fourth terminals 123 and 124 may be disposed on the lower surface of the board 110 and connected to both ends of the thermistor layer 140. Further, the third and fourth terminals 123 and 124 may be disposed so that one end portion thereof covers one surface of the thermistor layer 140, thereby improving connectivity.

In addition, the fourth and fifth terminals 124 and 125 may be disposed on the lower surface of the board 110 and connected to both ends of the resistance layer 150.

That is, the fourth terminal 124 may be connected to one end of the resistance layer 150 and one end of the thermistor layer 150, such that the fourth terminal 124 may be used as a common terminal for connecting the resistance layer 150 and the thermistor layer 140 in series or in parallel to each other.

Figure 6:
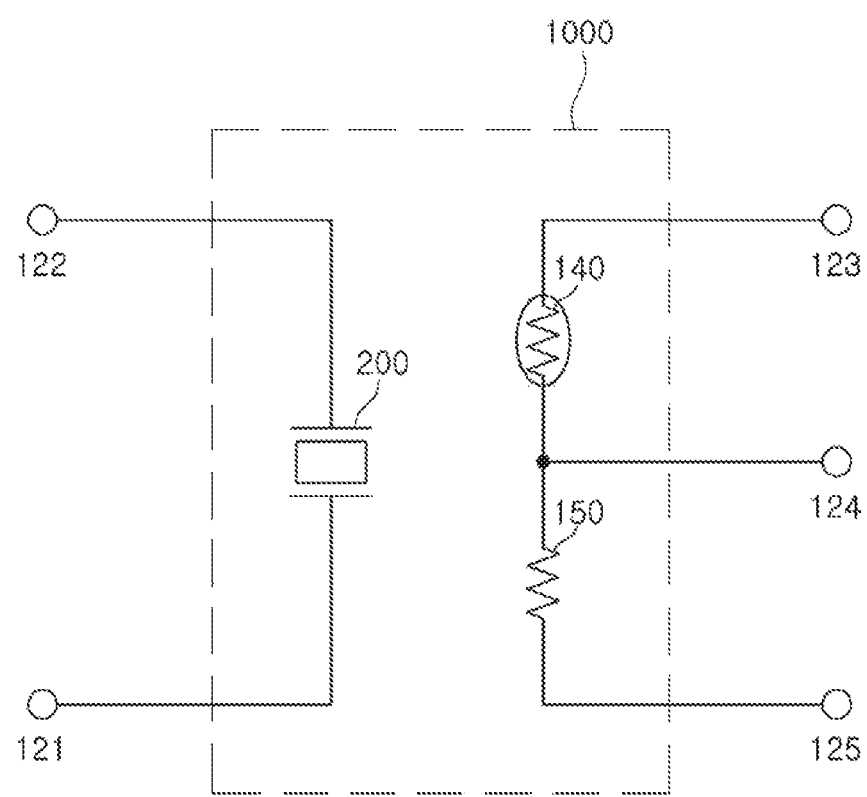
FIG. 6 schematically illustrates an equivalent circuit of a piezoelectric device package according to exemplary embodiments of the present disclosure.

FIG. 6 illustrates an equivalent circuit of a piezoelectric device package according to exemplary embodiments of the present disclosure.

The piezoelectric device package 1000 may include the piezoelectric device 200, the thermistor layer 140 and the resistance layer 150. Further, the first and second terminals 121 and 122 connected to both ends of the piezoelectric device 200, the third terminal 123 connected to the thermistor layer 140, and the fifth terminal 125 connected to the resistance layer 150 may be provided in the piezoelectric device package 1000. In addition, the fourth terminal 124 connected to a node between the thermistor layer 140 and the resistance layer 150 may be provided in the piezoelectric device package 1000.

Therefore, since the piezoelectric device package 1000 according to exemplary embodiments of the present disclosure additionally includes the thermistor for compensating for a temperature and a resistor for integration of a circuit, an integrated piezoelectric device package capable of implementing an integrated circuit may be provided.

As set forth above, in the piezoelectric device package according to exemplary embodiments of the present disclosure, since the thermistor layer is disposed on a mounting surface of the board, the piezoelectric device package may be thinned and rapidly sense heat generated in the board. Further, since the piezoelectric device package includes the resistance layer, a circuit using the piezoelectric device package may be integrated.

While example embodiments have been shown and described above, it will be apparent to those skilled in the art that modifications and variations could be made without departing from the scope of the present disclosure as defined by the appended claims.

What is claimed is:

1. A piezoelectric device package, comprising:
   a board having a lower surface and an upper surface;
   a plurality of terminals comprising a conductor disposed on the lower surface;
   a piezoelectric device disposed on the upper surface;
   a thermistor and a resistor disposed on the lower surface; and
   a cap lead covering an upper portion of the board,
   wherein a thickness of the conductor of the plurality of terminals is greater than a thickness of the resistor and the thermistor.

2. The piezoelectric device package of claim 1, wherein the thermistor and the resistor are formed using a thick film method.

3. The piezoelectric device package of claim 1, wherein the piezoelectric device is mounted on first and second excitation terminals disposed on the upper surface.

4. The piezoelectric device package of claim 3, wherein the first and second excitation terminals are electrically connected to terminals on the lower surface through first and second side terminals disposed in corners of a side surface of the board, respectively.

5. The piezoelectric device package of claim 1, wherein one of the plurality of terminals is connected to one end of the resistor and one end of the thermistor.

6. The piezoelectric device package of claim 1, further comprising a metal bonding layer bonding the board and the cap lead to each other.

7. The piezoelectric package of claim 1, wherein the thermistor and the resistor are formed directly on the board by a process other than chip-bonding.

8. The piezoelectric package of claim 1, wherein the thermistor is disposed immediately under the lower surface of the board.

9. A piezoelectric device package, comprising:
   a board having first and second surfaces;
   first to fifth terminals disposed on the first surface;
   a first excitation terminal disposed on the second surface and connected to the first terminal and a second excitation terminal disposed on the second surface and connected to the second terminal;
   a piezoelectric device mounted on the first and second excitation terminals;
   a thermistor layer disposed on the first surface and connected to the third and fourth terminals; and
   a resistance layer disposed on the first surface and connected to the fourth and fifth terminals.

10. The piezoelectric device package of claim 9, wherein the thermistor layer and the resistance layer are formed using a thick film method.

11. The piezoelectric device package of claim 9, wherein the first excitation terminal is connected to the first terminal through a first side terminal disposed in a corner of aside surface of the board, and the second excitation terminal is connected to the second terminal through a second side terminal disposed in another corner of the side surface of the board.

12. The piezoelectric device package of claim 9, further comprising a cap lead disposed on the first surface of the board and covering the piezoelectric device.

13. The piezoelectric device package of claim 12, further comprising a metal bonding layer bonding the board and the cap lead to each other.

14. The piezoelectric device package of claim 12, wherein the thermistor layer and the resistance layer are formed directly on the board by a process other than chip-bonding.

15. The piezoelectric device package of claim 12, wherein the thermistor layer is disposed immediately under the lower surface of the board.

16. A piezoelectric device package comprising: the piezoelectric device of claim 1 wherein at least one of the plurality of terminal extends from the lower surface to the upper surface, a portion thereof being disposed on a side surface of the board.

* * * * *